(12) United States Patent
Julien

(10) Patent No.: US 6,254,458 B1
(45) Date of Patent: Jul. 3, 2001

(54) POST PROCESSING FOR NITINOL COATED ARTICLES

(75) Inventor: Gerald J. Julien, Puyallup, WA (US)

(73) Assignee: Nitinol Technologies, Inc., Puyallup, WA (US)

(*) Notice: Subject to any disclaimer, the term of this patent is extended or adjusted under 35 U.S.C. 154(b) by 0 days.

(21) Appl. No.: 09/429,685

(22) Filed: Oct. 28, 1999

Related U.S. Application Data

(60) Provisional application No. 60/105,960, filed on Oct. 28, 1998.

(51) Int. Cl.$^7$ ........................................... B24B 1/00
(52) U.S. Cl. .......................... 451/41; 451/54; 451/60; 451/66; 451/177; 219/121.47; 219/121.48; 219/121.51; 219/76.16
(58) Field of Search ....................... 451/41, 54, 60, 451/66, 177; 219/121.47, 121.48, 121.51, 76.16

(56) References Cited

U.S. PATENT DOCUMENTS

| | | | |
|---|---|---|---|
| 3,174,851 | * 3/1965 | Buehler et al. | 75/170 |
| 5,160,802 | * 11/1992 | Moscrip | 89/16 |
| 5,298,835 | * 3/1994 | Muehlberger et al. | 315/111.21 |
| 5,744,777 | * 4/1998 | Bernecki et al. | 219/121.47 |
| 6,043,451 | * 3/2000 | Julien et al. | 219/121.47 |

* cited by examiner

Primary Examiner—Joseph J. Hail, III
Assistant Examiner—Shantese McDonald
(74) Attorney, Agent, or Firm—J. Michael Neary

(57) ABSTRACT

A process for post processing a part that has a Nitinol coating applied by plasma spraying or PVD coating gives the Nitinol desirable properties of toughness and malleability. It also produces a layer of surface material that is extremely hard, chemically non-reactive, electrically and thermally insulating. The process includes selecting a part that has a surface coating of Nitinol applied by plasma spraying or PVD coating and polishing the surface coating to give it a smooth and shiny surface. The polished surface is then cleaned to remove all polishing residue. The surface of the Nitinol coating is heated a temperature in a range of about 400° C. to 900° C.; and is rapidly cooled by forced air flow over the surface coating or by low temperature air or liquid immersion. Thereafter, the outer surfaces of the layer of surface material may be repolished and reheated as before to enhance the layer of thermally produced surface material.

5 Claims, 2 Drawing Sheets

POST PROCESSING FOR NITINOL COATED ARTICLES

This application claims the benefit of Provisional No. 60/105,960 filed Oct. 28, This invention pertains to environmental protection of metallic components by plasma deposition or physical vapor deposition of Nitinol alloys and particularly to the post processing of such coatings to give them enhanced properties.

BACKGROUND OF THE INVENTION

A need exists for improvements in the technology of providing protection against chemical and galvanic corrosion, erosion, and abrasion for metallic materials that are subjected to severe environments. These environments include exposure to wind, water, chlorides, acids, abrasion and erosion, to name a few.

Presently, the state of the art of environmental protection of metallic components is to apply paint, galvanizing, anodizing or epoxy to metal components, such as bolts, to protect them from the harmful influences noted above. However, these protective strategies are effective only temporarily at best, and often must be cut off when replacing at the end of a short life because the corrosion has made the corroded component an integral corroded mass with the mating component, making normal removal impossible. The problem is especially severe aboard ocean-going ships and in chemical and industrial plants where corrosive agents are in the environment.

SUMMARY OF THE INVENTION

Accordingly, it is an object of this invention to provide an improved protective coating on metal components that is resistant to chemical and galvanic corrosion, and is physically robust to resist chipping, erosion and abrasion so that the coating remains intact under must conditions of normal use. This procedure also allows for the production of metallic components that are superior in corrosion resistance and have an attractive hard and slippery coating.

This invention is a post processing procedure performed on the metal articles plasma-coated or coated by physical vapor deposition with a nickel-titanium alloy called Nitinol to provide superior environmental protection and desirable physical properties long sought in the industry in demanding applications. It includes coating by plasma spraying or physical vapor deposition Nitinol on a part or component to be protected from environmental damage, and heat treating the coating at about 400° C.–900° C. to give it the properties of ductility and toughness that will enable it to resist physical damage which otherwise could expose the substrate to the corrosive influences that the coating is supposed to protect it from.

DESCRIPTION OF THE DRAWINGS

The invention and its many attendent objects and advantages will become more apparent upon reading the following description of the preferred embodiment in conjunction with the following drawings, wherein.

DESCRIPTION OF THE PREFERRED EMBODIMENT

Figure 1:
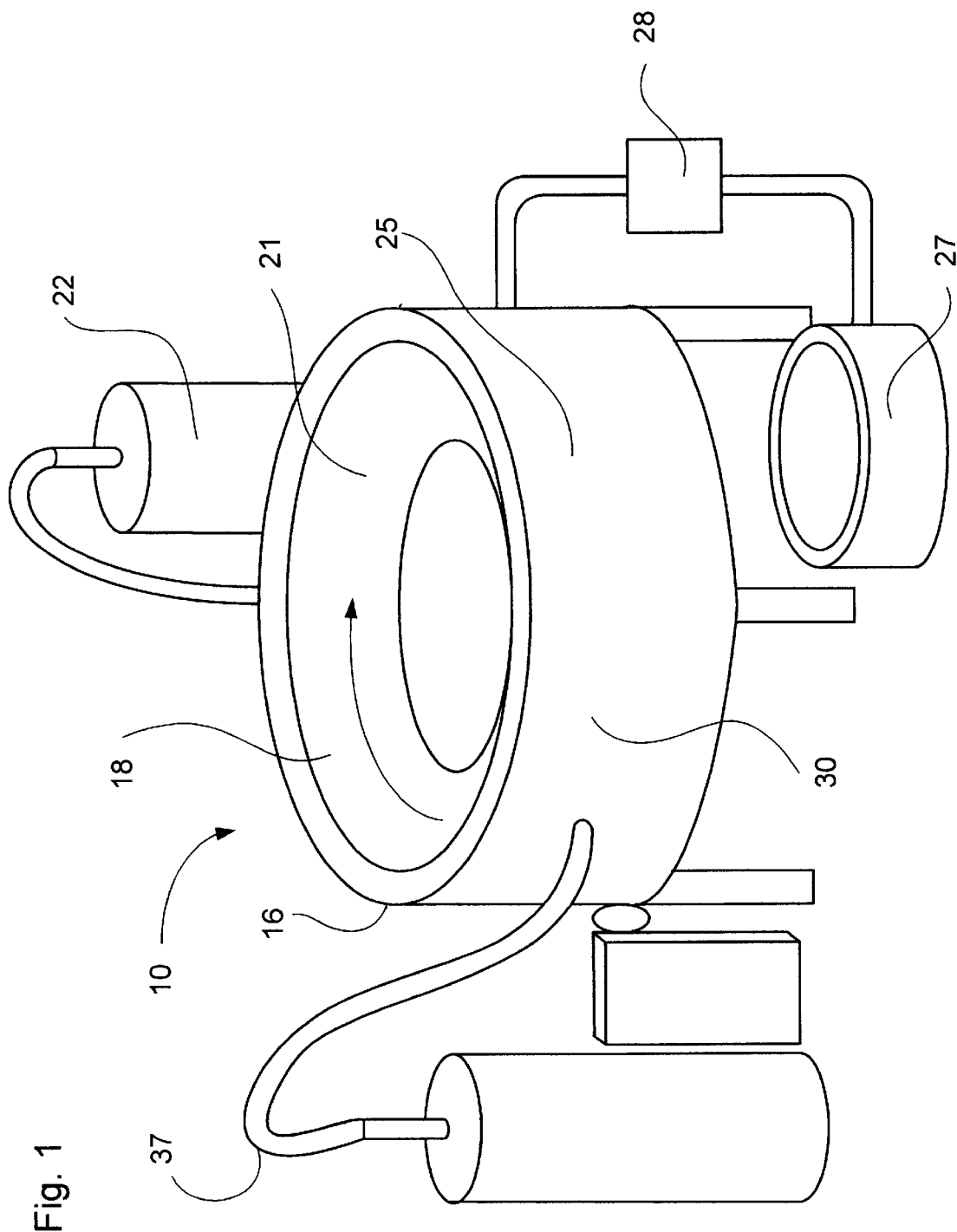
FIG. 1 is a schematic perspective view of an automated apparatus for performing the process of this invention.

Coating of Nitinol by plasma spraying or physical vapor deposition (PVD) on substrate materials of components or parts such as bolts, deck hardware and other mechanical components subject to corrosion in corrosive environments is a recent development that has a useful potential for providing environmental protecting for the component. All types of Nitinol materials can be plasma and PVD coated onto metallic materials, such as iron, steel, copper, brass, titanium, aluminum, stainless steel, etc. There are basically three primary types of Nitinol alloy now being produced by U.S. and foreign foundries. These are high transition temperature alloys, low transition temperature alloys (called superelastic) and a hard alloy called Type 60. These materials are well known and commercially available.

Each type of Nitinol alloy has basic characteristics that can be utilized to plasma or PVD coat components for different applications. All three types of alloy have some similar attributes, including excellent corrosion resistance, superior adhesion when applied by plasma coating to many materials, low coefficients of friction, and are non-magnetic. However, these materials tend to be brittle when applied by plasma or PVD coating, which can cause them to split, flake, or pop off the substrate when it flexes.

The properties of Nitinol as a coating appear to offer attractive potential. The high transition temperature alloy provides a very ductile low yield strength coating that would be useful on components that are subjected to extensive flexing (such as springs). The low transition temperature alloy has medium yield strength (higher than the high transition temperature alloy) and thus could provide higher erosion resistance. The Type 60 Nitinol alloy is a very hard material. Type 60 Nitinol can be post processed to have a hardness of up to 62 on the Rockwell C scale, and produces excellent erosion and abrasion resistance features, although is not as ductile as the other two types, so it would be most useful for applications on stiff components where extensive flexing is not a requirement. All three types of Nitinol have the unique property of producing a layer of hard surface material of different colors at different temperatures. The adhesion of Nitinol when applied by plasma and PVD coating processes to all metallic materials is excellent, however, the plasma and PVD coating as applied is somewhat brittle unless certain post processes disclosed in this invention are performed. These post processes are described in detail below.

In addition to providing an excellent environmental coating, plasma Nitinol coated components can be processed to have a smooth or textured colored finish. The color of this finish can be chosen from a range of light gold, silver, red/purple, blue etc, to black. The corrosion resistance, hardness, yield strength and erosion and abrasion resistance of the coatings of all these colored coatings are all excellent.

There are two different Nitinol coating processes contemplated in this invention. One is a particle vapor deposition (PVD) process performed in a very low pressure chamber in which a Nitinol target acts as one electrode in a high voltage electric arc. Nitinol material is vaporized from the target surface in the arc and is transported as a Nitinol vapor by an electric field or gravity to the substrate where it is deposited. The Nitinol coating in the PVD process is applied in a thickness of about 2 to 20 micro-meters (microns) and is a light gray in color. The plasma spraying process is performed in a low pressure chamber by injecting Nitinol powder or melting Nitinol wire in minute droplets into a high temperature stream of ionized gas such as a mixture of argon and hydrogen. The powder particles melt in the plasma flame and are transported at high velocity to impact against the substrate to produce a thick coating of Nitinol.

A heat-treating step is desirable to improve the toughness, malleability or hardness of the Nitinol coating, depending upon the Nitinol alloy used, and to produce a surface layer that is extremely hard, chemically non-reactive, and electrically insulating. To make the coated finish bright and shiny, the coated surface of the part may be polished prior to the first application of heat. If a shiny finish is not needed, or if it is desired that the part not have a shiny finish, then the polishing step may be omitted. The heat-treating process (thermal treatment) can be performed in a conventional heat treating furnace, but using a furnace does have its limitations. The rate of change of temperature in a furnace for a rapid cooling rate is more difficult to control than by flame heating. The cooling rate of the surface appears to be important in achieving control over the color of the surface finish.

The surface finish is believed to be a thermally produced layer formed on the Nitinol coating during the heating process. It is believed to be a complex amorphous composition including various nickel and titanium oxides and perhaps other materials such as nitrides. It is unique to Nitinol alloys. This surface material, which will herein be referred to as a "thermally produced surface layer" or as an "oxide", whatever its actual composition, is generated when the Nitinol material is heated to a specific temperature and exposed to air. The oxide acts like, and is believed to be, a form of ceramic that is produced on the surface of the Nitinol. It is very hard and resistant to most chemicals, even heated etching chemicals. It is also an electrical insulator and has low thermal conductivity.

The desired color of the thermally produced surface layer is preferably obtained by polishing the surface of the Nitinol coating on the part using a polishing compound having fine diamond particles in a carrier paste. After polishing, the part is thoroughly cleaned by washing in a strong detergent to remove the residue produced by polishing. Cleaning is important because residue on the surface will cause discoloration during the subsequent heat treating process. Caution must be used not to touch the cleaned surface with bare skin before heat treating because the heat treatment will cause the skin oil film (fingerprints) to produce permanent marks on the surface of the part. This cleaning of the component is especially important when the surface appearance of the part is important, such as boat and automobile hardware, architectural trim, medical instruments etc.

After cleaning, the component is installed in a fixture and undergoes a heat treating process treated at specific temperatures. If a shiny finish is not required on the part, the polishing process can be omitted, although the coloration is less apparent on a rough surface. However, the part should still be cleaned prior to the heat treating process. As stated above, two different processes can be used to heat treat the coated parts.

1. Conventional furnace heat treating

The parts can be heat treated in either an air or controlled atmosphere furnace by heating the part to temperatures of above about 400° C. It appears that the optimal temperature range is between 400° C. and 800° C. although heating to 900° C. may be additionally efficacious. Long term exposure to these temperatures is not required as the only requirement is to expose the Nitinol coating to a specific temperature in the presence of air. The lower temperatures within that range will generate different colors than the higher temperatures. For example the lower temperatures will produce a light gold color and the higher temperatures a dark black color. To further enhance the black color, the part can be removed from the furnace while hot and be quenched in a cold liquid bath or a cold air draft at a temperature of below 32° F. To further produce a bright shiny part, additional polishing with diamond paste and jewelers rouge is performed after the coloration step is finished. If required, repeated iterations of these steps can be performed to further enhance the colors produced during the first heat treatment. For example, a part that is light gold in color can be heat treated at somewhat higher temperatures to produce a dark gold color or blue or black color.

2. Heat treating by external methods

The preferred process to make the Nitinol coating on the parts tough and malleable and finished with the thermally produced surface layer is to use direct external heating methods. These methods include heating the surface of the part with a hot flame produced by gas torches (e.g. MAPP, propylene, acetylene), or by induction heating, or coil heating elements. One advantage of using external heat treating processes is the colors can be visually monitored and the heat source removed when the desired color is obtained, although it does require some manual dexterity on the part of the torch operator. Additionally this method allows for the coating colors to be more precisely produced. In fact, some colors can only be produced using this process, as the rate of heat removable or cooling determines specific colors. One way of obtaining a desired rapid rate of cooling is by heating the part in a cold ambient temperature, such as outdoors or in a refrigerated room or by blowing cold air across the part during the heating process. When the desired color of the thermally produced surface layer is obtained on the Nitinol coating, the color can be stabilized (not changed to a darker color) by quenching the part immediately in a water bath. Further enhancement of the appearance of the part can be obtained by final polishing and buffing operations, using diamond paste and jewelers rouge. The above-described processes can be accomplished manually or with automatic process equipment such as shown in FIG. 1. This apparatus automatically performs the process of this invention to precisely produce the thermally produced surface layer in specific colors on the Nitinol coating after it has been applied to a substrate by PVD or plasma spraying.

The apparatus 10 shown in FIG. 1 is an automated post processing system having stations for performing the several operations described above on Nitinol coated articles such as parts or components. One such article is the bolt 15 shown in FIG. 2. The apparatus 10 of FIG. 1 includes a circular or elliptical enclosure or cabinet 16 within which the several operations are performed. Naturally, the apparatus could also be linear, wherein the articles are loaded in at one end and the treated articles removed from the other end. The articles are conveyed through several stations in the apparatus 10 by a conveyor 17 under control of a conveyor control and drive mechanism (not shown) of known design.

Figure 2:
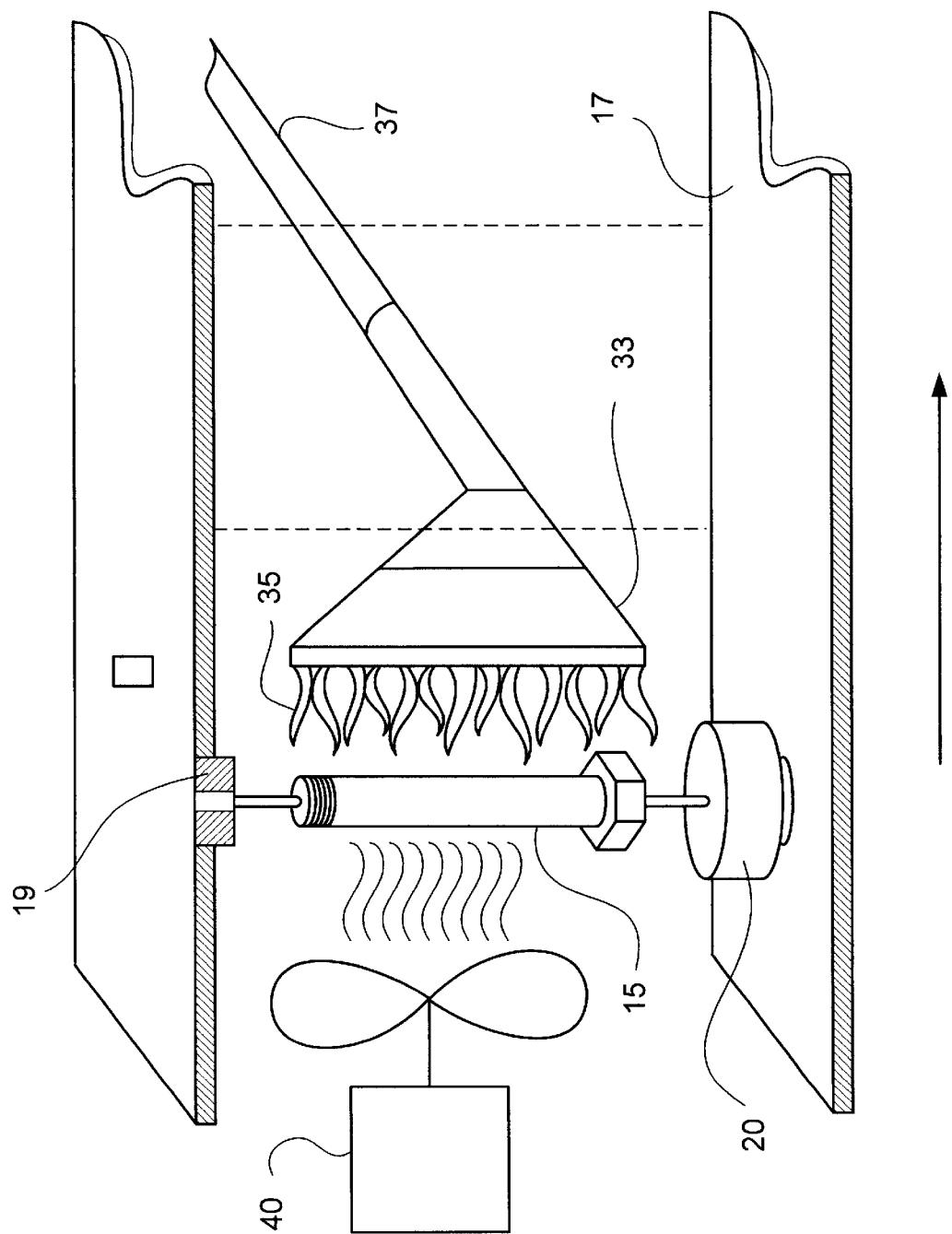
FIG. 2 is a schematic perspective view of a heat treating station in the apparatus of FIG. 1.

The apparatus 10 includes a loading/unloading station 18 where the articles 15 enter into the apparatus, either by being mounted on holding fixtures 19, shown in FIG. 2, which rotate the article as it is conveyed through the several stations by a rotation mechanism 20 as it is conveyed sequentially through the several stations, or are pre-mounted on fixtures which are inserted into the apparatus 10 for carrying the articles around through the apparatus through the several stations to the unload part of station 18.

The articles 15 are conveyed on their fixtures clockwise in FIG. 1 into a polishing area 21 where they are polished by one or more buffing wheels driven by a control and drive system 22. The buffing wheels are periodically loaded with a polishing compound. For articles that must be given a very smooth finish, the articles could be pre-polished or initially polished before being treated in this apparatus 10. The polishing station could be omitted for articles that do not require polishing or which must have a dull, non-reflective finish.

After polishing, the articles are conveyed to a cleaning station 25 where they are scrubbed with rotating brushes while flooded with water and detergent from a wash water source such as a storage tank 27 by means of a pump 28. The articles are preferably rinsed and then blown dry as they pass through the cleaning station 25.

The cleaned and polished articles are now conveyed into a heat treating station 30, shown in FIG. 2, which includes a gas torch nozzle 33 which directs a gas flame 35 against the entire article 15. The gas for the flame 35 is conveyed through a conduit 37 and is mixed in the nozzle 33 for burning with air or with oxygen conveyed through a separate pipe in the conduit 37. As the rotation mechanism 20 rotates the article 15 in the flame 35, a blower 40 directs a flow of cooling air over the article 15 to promote rapid cooling.

Benefits of the technology (applications)

a. On bolts the post processed Nitinol coating makes fasteners slippery and corrosion resistant, which makes installation and removal of the bolts in wood structures easy.

b. For mechanical disassembly the bolts allow for easy removal, which is not possible by prior art stainless steel or bronze corrosion resistant bolts. Stainless steel and common steel bolts now used for assembly of the mechanical parts on cooling towers, pulp and paper plants and other installations having an environment containing corrosive agents, must be cut off to allow removal of fans, reduction gears etc.

c. High strength steel bolts cannot be used to assemble equipment that is subjected to corrosive environments as they corrode easily. Thus, stainless steel fasteners are normally used. The size of the stainless steel fasteners must be increased because of the lower strength of stainless steel. Nitinol coated high strength steel bolts allow for a size reduction in many mechanical installations and long duration life in use. They also allow for easy removal and reuse of the fasteners, thus lower overall costs.

d. The thermally produced layer of surface material on the Nitinol coating provides a non-stick finish that is excellent for instruments, such as medical instruments, tools and automobile parts, cutting tool cutters, and wheel rims for example. Another example is the use of the coating in the food processing industry. All kinds of food handling equipment can be coated which would provide a non-stick, corrosion proof finish, like meat and fish processing. Another interesting application is coating frying pans.

e. Another application is on fan blades, propellers, fishing equipment and gun components (barrels, clips etc.).

f. Ways and guides coated with Type 60 Nitinol provide extremely hard wear surfaces for moving elements in a machine. The same is true of bearing races.

Obviously, numerous modifications and variations of the preferred embodiment described above are possible and will become apparent to those skilled in the art in light of this specification. For example, many functions and advantages are described for the preferred embodiment, but in many uses of the invention, not all of these functions and advantages would be needed. Therefore, I contemplate the use of the invention using fewer than the complete set of noted features, benefits, functions and advantages. Moreover, several species and embodiments of the invention are disclosed herein, but not all are specifically claimed, although all are covered by generic claims. Nevertheless, it is my intention that each and every one of these species and embodiments, and the equivalents thereof, be encompassed and protected within the scope of the following claims, and no dedication to the public is intended by virtue of the lack of claims specific to any individual species.

Accordingly, it is expressly intended that all these embodiments, species, modifications and variations, and the equivalents thereof, are to be considered within the spirit and scope of the invention as defined in the following claims, wherein I claim:

1. A process for producing a thermally produced layer of surface material on a part that has a Nitinol coating applied by plasma spraying or PVD coating, comprising:

a) selecting a part that has a surface coating of Nitinol applied by plasma spraying or PVD coating;

b) heating said surface coating to a temperature in a range of about 400° C. to 900° C.; and c) rapidly cooling said surface coating by forced air flow over said surface coating or by low temperature air immersion.

2. A process as defined in claim 1, further comprising: polishing said surface coating before said heating step to give said layer of surface material a smooth and shiny surface.

3. A process as defined in claim 2, further comprising: polishing outer surfaces of said layer of surface material and then repeating steps b) and c) of claim 1.

4. A process as defined in claim 3, further comprising: cleaning said outer surfaces of said layer of surface material after said polishing step of claim 2, before said repeating steps.

5. An apparatus for producing a layer of surface material on a part that has a Nitinol coating applied by plasma spraying or PVD coating, comprising:

an enclosure containing a plurality of processing stations for sequentially processing articles conveyed through said stations;

a polishing and cleaning station for producing a clean, polished surface on said article;

a cleaning station for cleaning polishing residue off of said article after it passes through said polishing and cleaning staion;

a heat treating station for heating said article to a temperature in the range of about 400° C. to 900° C. and for rapidly cooling said article; and one or more transfer stations for loading and unloading articles into and out of said apparatus.

* * * * *